(12) United States Patent
Gleason et al.

(10) Patent No.: US 7,339,760 B2
(45) Date of Patent: Mar. 4, 2008

(54) INTEGRATED BIAS AND OFFSET RECOVERY AMPLIFIER

(75) Inventors: Jeffrey A. Gleason, Burnsville, MN (US); John D. Leighton, Anoka, MN (US); Scott M. O'Brien, Eagan, MN (US)

(73) Assignee: Agere Systems Inc., Allentown, PA (US)

( * ) Notice: Subject to any disclaimer, the term of this patent is extended or adjusted under 35 U.S.C. 154(b) by 105 days.

(21) Appl. No.: 10/955,775

(22) Filed: Sep. 30, 2004

(65) Prior Publication Data

US 2005/0168860 A1 Aug. 4, 2005

Related U.S. Application Data

(60) Provisional application No. 60/540,451, filed on Jan. 30, 2004.

(51) Int. Cl.
*G11B 5/02* (2006.01)
(52) U.S. Cl. .............................. 360/67; 360/66; 360/68; 360/46
(58) Field of Classification Search ...................... None
See application file for complete search history.

(56) References Cited

U.S. PATENT DOCUMENTS

| | | | | |
|---|---|---|---|---|
| 6,108,151 A * | 8/2000 | Tuttle et al. | .................. | 360/51 |
| 6,111,717 A * | 8/2000 | Cloke et al. | .................. | 360/67 |
| 6,140,872 A * | 10/2000 | McEldowney | ................. | 330/9 |
| 6,219,194 B1 * | 4/2001 | Stein et al. | ................... | 360/66 |
| 6,404,578 B1 * | 6/2002 | Bhandari et al. | ............. | 360/61 |
| 6,424,480 B1 * | 7/2002 | Bhandari et al. | ............. | 360/67 |
| 6,462,600 B2 * | 10/2002 | Pakriswamy | ................ | 327/307 |
| 6,522,492 B1 * | 2/2003 | Ranmuthu et al. | ............ | 360/67 |
| 6,587,296 B1 * | 7/2003 | Iroaga et al. | ................. | 360/63 |
| 6,614,301 B2 * | 9/2003 | Casper et al. | ............... | 330/253 |
| 6,621,649 B1 * | 9/2003 | Jiang et al. | ................... | 360/67 |
| 6,650,182 B2 * | 11/2003 | Kim et al. | .................. | 330/252 |
| 6,721,117 B2 * | 4/2004 | Briskin | ....................... | 360/66 |
| 6,751,034 B1 * | 6/2004 | Bloodworth et al. | ......... | 360/46 |
| 6,920,002 B2 * | 7/2005 | Sako et al. | ................... | 360/46 |
| 6,947,238 B2 * | 9/2005 | Takayoshi et al. | ........... | 360/66 |

\* cited by examiner

*Primary Examiner*—Hoa T. Nguyen
*Assistant Examiner*—Dismery Mercedes
(74) *Attorney, Agent, or Firm*—Kinney & Lange, PA

(57) ABSTRACT

A preamplifier circuit is connected to a transducing head, and has integrated bias circuitry and offset recovery circuitry. The offset recovery circuitry is activated in response to a transition from write mode to read more to provide an output signal representative of a signal across the transducing head. The bias circuitry is driven by the output signal of the offset recovery circuitry to bias the transducing head.

16 Claims, 10 Drawing Sheets

INTEGRATED BIAS AND OFFSET RECOVERY AMPLIFIER

CROSS-REFERENCE TO RELATED APPLICATION(S)

This application claims the benefit of U.S. Provisional Application No. 60/540,451 filed Jan. 30, 2004 for "Read Preamplifier Utilizing an Integrated Bias and Offset Recovery Loop for Fast Write to Read Recovery" by J. Gleason, J. Leighton and S. O'Brien.

INCORPORATION BY REFERENCE

The aforementioned U.S. Provisional Application No. 60/540,451 is hereby incorporated by reference in its entirety.

BACKGROUND OF THE INVENTION

The present invention relates to a read preamplifier for a data transducing system such as a hard disk drive, and more particularly to a read preamplifier that has integrated bias and offset recovery circuitry.

Many microelectronic applications employ systems involving a transducer that generates an electrical system as the result of some external stimulus. The signal generated by the transducer is typically small in magnitude, and thus requires the use of a preamplifier for amplification before signal processing is performed. Furthermore, it is also usually the case that the transducer requires a DC bias for proper operation. Such applications therefore typically include circuitry that serves to both supply bias to the transducer and to provide amplification of the signal generated by the transducer. It is also useful in many applications for this circuitry to be able to transition the transducer bias from an off-state to its steady-state and be capable of linear amplification very rapidly. One such application is a hard disk drive.

The reader circuitry of a preamplifier for a hard disk drive performs two primary functions. One of these functions is to amplify the voltage signal generated by a magneto-resistive transducer (MR head) and deliver this signal with high fidelity to a read channel for data recovery. The second function of the reader is to provide either an accurate DC voltage or current bias to the MR head. While reading data, the MR head (typically modeled as a resistor $R_{MR}$) can typically be biased at voltage levels between 25 milli-Volts (mV) and 300 mV, or at current levels between 100 micro-Amperes (μA) and 5 milli-Amperes (mA). While writing data, the bias applied to the MR head is usually reduced to a very low value or even to zero for reliability reasons. In the interest of efficiently using the space available on the disk, it is desirable for the reader circuitry to be able to transition the head bias from zero to its full read-mode value very quickly and begin passing data to the read channel. This transition period is referred to in the industry as "write-to-read recovery time." Currently, state of the art recovery schemes achieve write-to-read recovery times of less than 100 nano-seconds (ns), meaning that the head bias reaches its steady state value so that reading can occur within 100 ns.

For a preamplifier circuit to be considered "recovered" and ready to read data, it has to both establish the proper bias of the MR head and recover (zero-out) the offset created in the data path by the bias change. This figure is usually quantified by specifying a maximum allowable DC baseline error that can exist after the write-to-read recovery period ends.

Traditionally, reader circuits have employed circuitry for biasing the MR head and amplifying the read-back signal that operates essentially independent from one another. In this configuration, the bias circuitry uses a closed-loop feedback system which compares the voltage developed across the head to a fixed reference. The read amplifier also employs a separate feedback loop to recover the offset created by the non-zero head bias. For reasons of stability and head reliability, the sense amplifier operates at a significantly faster speed than the bias loop to prevent bias overshoot. Therefore, the speed at which the head bias can be transitioned is limited by the finite bandwidth of the sense amplifier.

In addition to this limitation, typical preamplifier design requirements also call for the reader to function well over a range of head resistances that can span a ratio range of five to one. This makes the task of providing short write-to-read recovery times for readers that have independent bias and sense amplifier feedback loops rather difficult, since the speed of the bias loop varies directly with $R_{MR}$ while the speed of the sense amplifier loop varies inversely with $R_{MR}$. Thus, the write-to-read recovery time of a reader architecture that uses an independent bias loop is constrained by its worst-case operating point, which resides at either the minimum or maximum of the $R_{MR}$ spectrum.

Disk drive manufacturers are requesting that preamplifiers have write-to-read recovery times of 50 ns or less. In order to provide a preamplifier that achieves this level of performance, a new architecture is proposed.

BRIEF SUMMARY OF THE INVENTION

The present invention is a preamplifier circuit connected to a transducing head that has integrated bias circuitry and offset recovery circuitry. The offset recovery circuitry is activated in response to a transition from write mode to read more to provide an output signal representative of a signal across the transducing head. The bias circuitry is driven by the output signal of the offset recovery circuitry to bias the transducing head.

DETAILED DESCRIPTION

Figure 1:
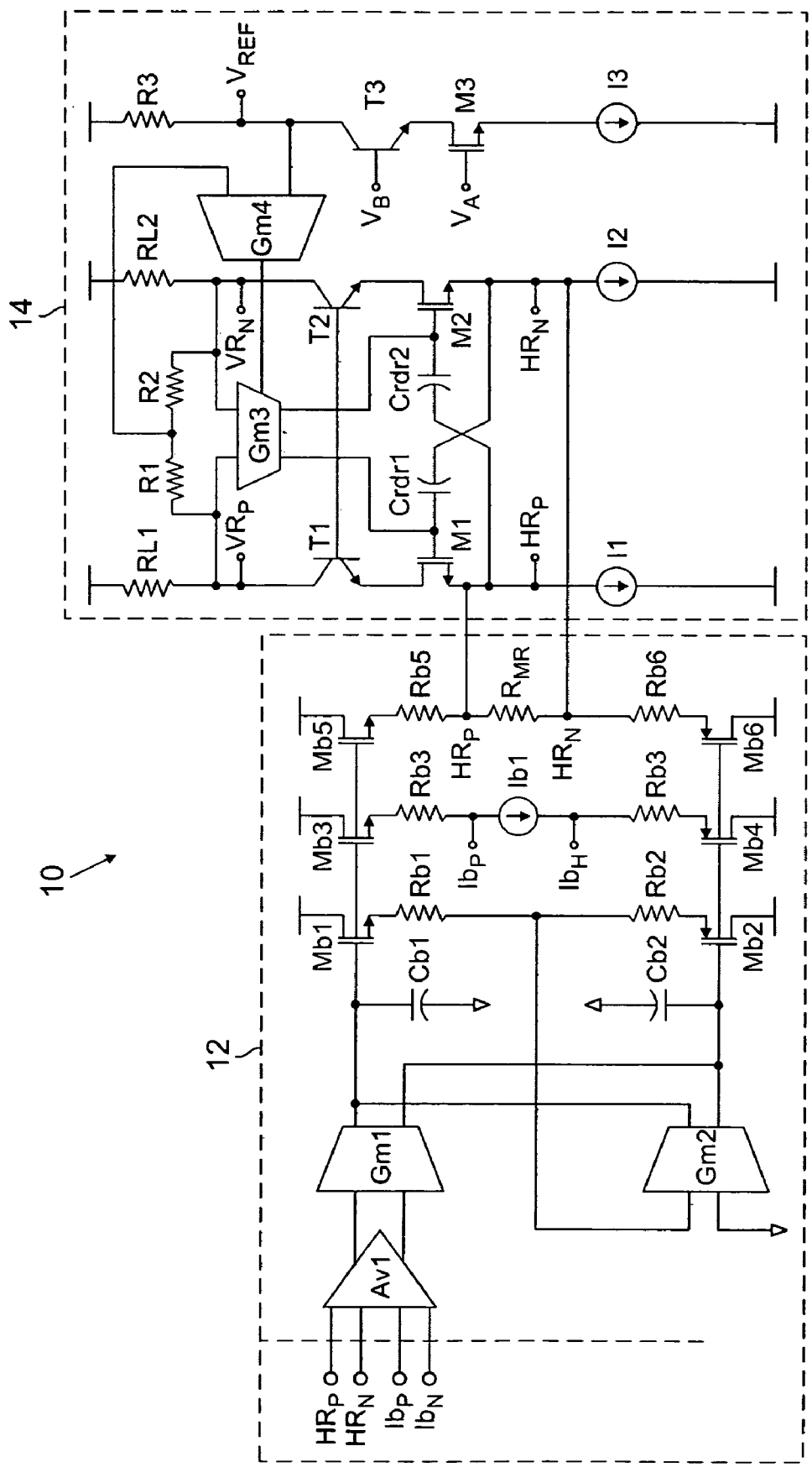
FIG. 1 is a schematic diagram of a conventional preamplifier circuit employing separate bias circuitry and offset recovery circuitry.

FIG. 1 is a schematic diagram of preamplifier circuitry 10 employing a separate bias circuit 12 (for biasing a magnetoresistive (MR) transducing head) and offset recovery circuit 14 (for amplifying the signal read by the MR transducing head), as has been conventionally done in the past. The transducing head is represented as resistor $R_{MR}$ connected between head terminals $HR_p$ and $HR_N$. Bias circuit 12 includes amplifier Av1, transconductance amplifiers Gm1 and Gm2, capacitors Cb1 and Cb2, transistors Mb1, Mb2, Mb3, Mb4, Mb5 and Mb6, current source Ib1, and resistors Rb1, Rb2, Rb3, Rb4, Rb5 and Rb6, connected as shown in FIG. 1. Offset recovery circuit 14 includes transistors M1, M2, M3, T1, T2 and T3, capacitors Crdr1 and Crdr2, current sources I1, I2 and I3, load resistors RL1 and RL2, resistors R1, R2 and R3, and transconductance amplifiers Gm3 and Gm4, connected as shown in FIG. 1.

The differential loop gain equation for bias circuit 12 is as follows:

$$A_V^{BiasLoop} = A_{V1} \cdot \frac{g_{m1}}{j\omega C_b} \cdot \frac{1}{1+2R_b/R_{MR}} \quad \text{(Eq. 1)}$$

Equation 1 can be used to solve for the Unity-Gain-Frequency (UGF) of bias circuit 12 as follows:

$$UGF_{BiasLoop} = A_{V1} \cdot \frac{g_{m1}}{2\pi C_b} \cdot \frac{1}{1+2R_b/R_{MR}} \quad \text{(Eq. 2)}$$

The UGF of bias circuit 12 describes how fast the loop can change the bias of the transducing head. It can be seen from Equation 2 that the bandwidth of bias circuit 12 will increase with $R_{MR}$.

The differential loop equation for offset recovery circuit 14 is as follows:

$$A_V^{ReaderLoop} = \frac{2R_L}{R_{MR}+r_s} \cdot \frac{g_{m3}}{j\omega C_{rdr}} \quad \text{(Eq. 3)}$$

where $r_s$ is the impedance looking back into the source terminals of transistors M1 and M2. The UGF of this loop is as follows:

$$UGF_{ReaderLoop} = \frac{2R_L}{R_{MR}+r_s} \cdot \frac{g_{m3}}{2\pi C_{rdr}} \quad \text{(Eq. 4)}$$

Equation 4 shows that the UGF of offset recovery circuit 14 will decrease with $R_{MR}$, opposite to the response of bias circuit 12.

Figure 2:
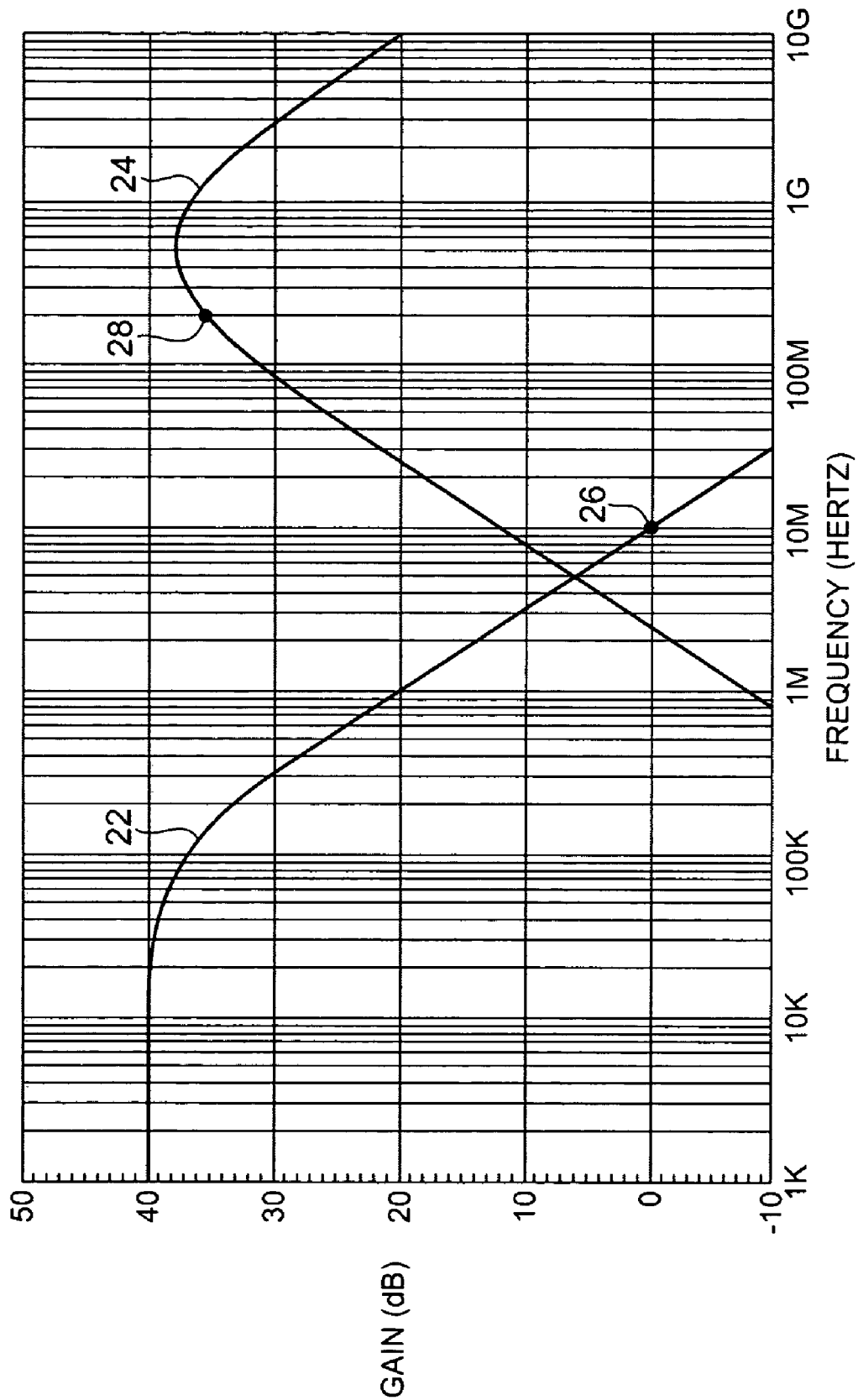
FIG. 2 is a graph showing the frequency responses of separate bias circuitry and offset recovery circuitry, and their inverse relationships with respect to one another.

In order for preamplifier circuit 10 to satisfy the strict bias accuracy requirements (typically ±5%) imposed on it, the bandwidth of bias circuit 12 is limited to a low enough value so that offset recovery circuit 14 is able to track any change in the head voltage. FIG. 2 is a graph showing the frequency responses of bias circuit 12 and offset recovery circuit 14 and their inverse relationships with respect to one another. Curve 22 represents the open loop gain of bias circuit 12, while curve 24 represents the frequency response of offset recovery circuit 14. In configurations having independent bias and offset recovery circuits, such as is shown in FIG. 1, the 0 dB point of bias circuit curve 22 (identified with reference numeral 26) must be separated in frequency from the high corner of offset recovery circuit curve 24 (identified with reference numeral 28), to ensure stability in the preamplifier circuit, essentially to prevent the two circuits from affecting each other's operations. This limits the speed of bias circuit 12, which effectively becomes the limiting factor in the overall speed of preamplifier circuit 10.

Figure 3:
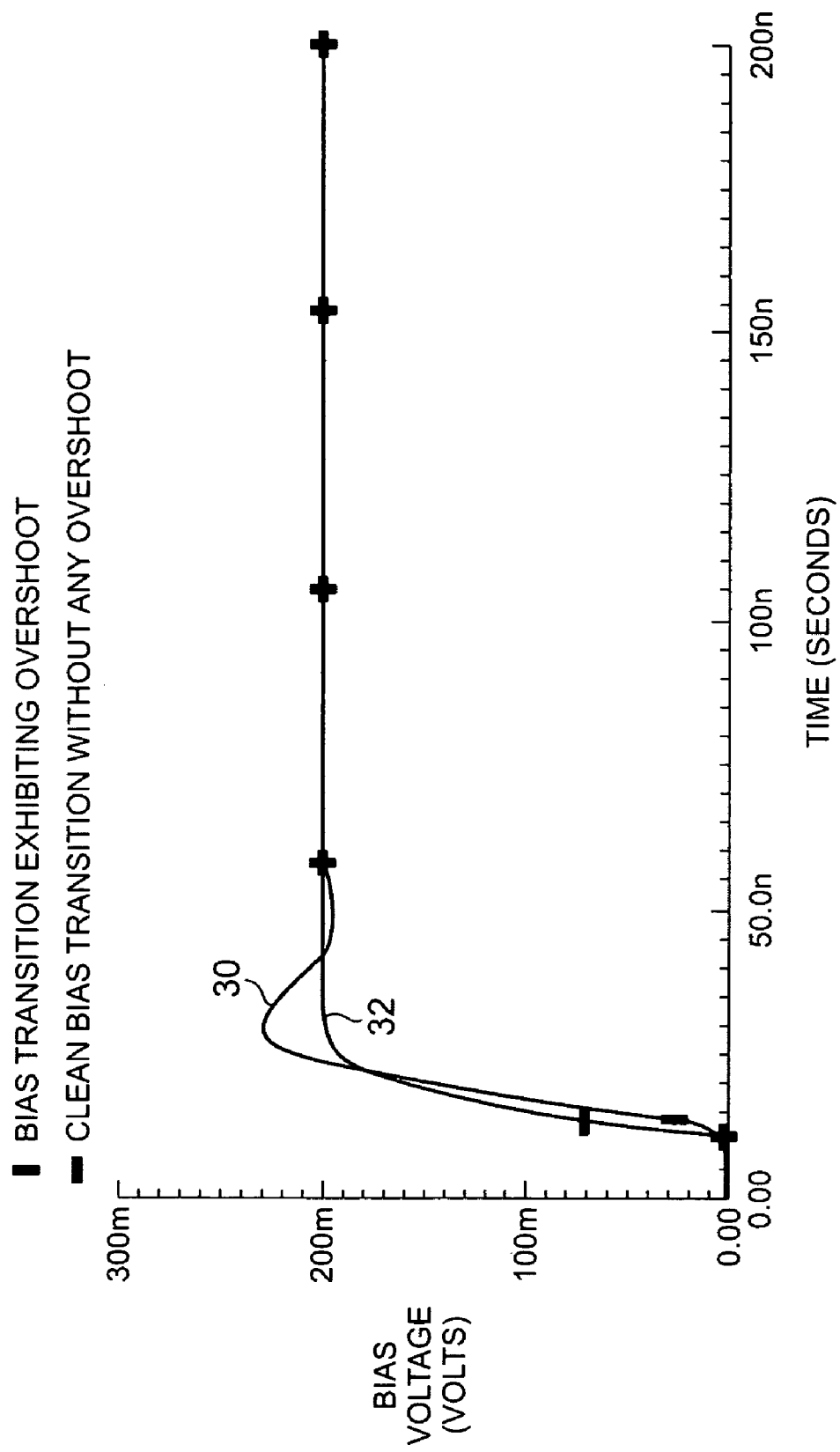
FIG. 3 is a graph comparing a bias transition curve that exhibits overshoot with a bias transition curve that makes a clean bias transition without any overshoot.

FIG. 3 is a graph comparing bias transition curve 30 that exhibits overshoot with bias transition curve 32 that makes a clean bias transition without any overshoot, as desired in preamplifier applications. If the bandwidth of bias circuit 12 is not limited to a value low enough for offset recovery circuit 14 to track changes in the head voltage, overshoot will result as shown by curve 30, which is not acceptable in most applications.

Limiting the bandwidth of bias circuit 12 to avoid overshoot has the undesirable consequence of also limiting write-to-read recovery performance. The fact that the bandwidths of bias circuit 12 and offset recovery circuit 14 vary oppositely with $R_{MR}$ only exacerbates this problem.

Figure 4:
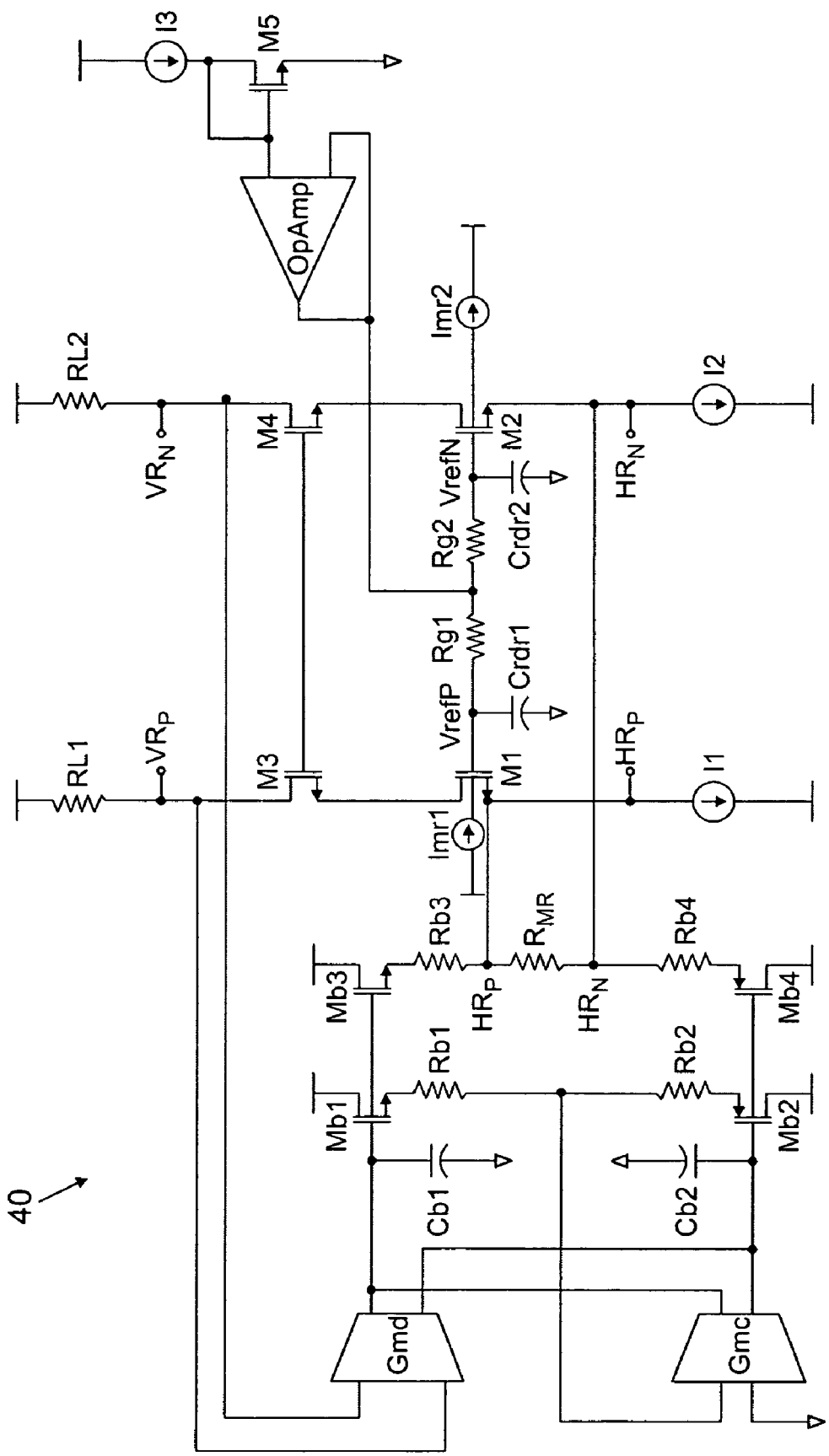
FIG. 4 is a schematic diagram of a preamplifier circuit having an integrated bias circuit and offset recovery circuit according to an embodiment of the present invention.

FIG. 4 is a schematic diagram of preamplifier circuit 40 having an integrated bias circuit and offset recovery circuit according to an embodiment of the present invention. The bias and offset recovery circuitry of preamplifier circuit 40 are configured in a similar manner to bias circuit 12 and offset recovery circuit 14 shown in FIG. 1, but are related to one another in such a way that overall circuit performance is improved over a wide range of transducing head resistances. The offset recovery circuit includes transistors M1, M2, M3, M4 and M5, resistors Rg1 and Rg2, load resistors RL1 and RL2, capacitors Crdr1 and Crdr2, current sources I1, I2, I3, and Imr1 and Imr2, and operational amplifier OpAmp, connected as shown in FIG. 4. A transducing head (modeled as resistor $R_{MR}$) is connected across head terminals $HR_p$ and $HR_N$. The bias circuitry includes transconductance amplifiers Gmd and Gmc, capacitors Cb1 and Cb2, transistors Mb1, Mb2, Mb3 and Mb4, current source Ib1, and resistors Rb1, Rb2, Rb3 and Rb4, connected as shown in FIG. 4.

In operation, a reference voltage corresponding to the desired voltage across the head (between head terminals $HR_p$ and $HR_N$) is developed across 2Rg (the sum of the resistances of Rg1 and Rg2) by application of a reference current from current sources Imr1 and Imr2. Current sources Imr1 and Imr2 are activated by appropriate logic (not shown in FIG. 4) in response to a commanded switch between a write mode and a read mode. In one embodiment, the Imr currents can be implemented with a "Zero Temperature Coefficient" current to create a reference signal that is constant over normal process and temperature variations. The Imr currents are provided to resistors Rg1 and Rg2 via current mirrors, for example. Capacitors Crdr1 and Crdr2 are provided to filter the thermal noise associated with resistors Rg1 and Rg2. The circuit employing operational amplifier OpAmp, transistor M5 and current source I3 provides common mode protection, to ensure that the common mode head voltage is held at ground by forcing the node between resistors Rg1 and Rg2 to a value of one gate-to-source voltage drop above ground through a reference circuit biased to have an identical current density.

Application of the current from current sources Imr1 and Imr2 through resistors Rg1 and Rg2 creates a voltage differential between nodes VrefP and VrefN. This voltage differential causes the M1 leg of the circuit (including transistors M1 and M3) to conduct more current than the M2 leg of the circuit (including transistors M2 and M4), creating a voltage differential between output nodes VRP and VRN that reflects the voltage difference across the head. This voltage differential is input to transconductance amplifier Gmd, and is used as the signal to turn on the bias circuit. In this way, the bias circuit is activated in response to a command to switch from write mode to read mode, since the voltage differential between nodes VRP and VRN is reflective of a voltage across the head, which exists only in read mode. Transconductance amplifier Gmd drives the bias circuit to operate in a manner known in the art set a bias voltage across the head (Rmr). Changes in the bias voltage affect the conduction of the M1 and M2 legs of the offset recovery circuit, and are therefore quickly reflected at VRP and VRN, which allows for quick tracking by the circuit.

By configuring preamplifier circuit 40 in an open-loop feedback configuration, with the differential output of the offset recovery circuit being used as the input for driving the bias circuit, only one loop is required to recover the preamplifier offset. This eliminates the need to separate the unity gain frequency of the bias circuit from the frequency response of the offset recovery circuit (as described in the discussion of the prior art with respect to FIG. 2), which allows the overall write-to-read response time of the preamplifier to be improved. High performance reader circuits offer a high-corner frequency in excess of 1 giga-Hertz (GHz). This permits the unity gain frequency (UGF) of the offset recovery circuit to be set in the 100-250 mega-Hertz (MHz) range (keeping this frequency appropriately spaced from the high-corner frequency to maintain stability of the circuit). This UGF frequency corresponds to time constants in the range of 600 pico-seconds (ps) to 1.6 nano-seconds (ns). Because of this speed, preamplifier circuit 40 is able to achieve write-to-read recovery times of 50 ns or less, offering significant improvement in speed over the prior art.

The equation that describes the differential loop gain of the open-loop preamplifier circuit 40 is as follows:

$$A_V^{Loop} = \frac{R_L}{r_s} \cdot \frac{g_{md}}{j\omega C_b} \cdot \frac{R_{MR} \| 2r_s}{R_{MR} \| 2r_s + 2R_b} \quad (\text{Eq. 5})$$

In nearly all applications, $2r_s$ is much less than $R_{MR}$, so Equation 5 can be reduced to:

$$A_V^{Loop} = \frac{R_L}{r_s + R_b} \cdot \frac{g_{md}}{j\omega C_b} \quad (\text{Eq. 6})$$

Therefore, the loop gain of the offset recovery circuit (and consequently the write-to-read recovery performance) is independent of the value of head resistance $R_{MR}$, and the write-to-read performance of preamplifier circuit 40 is maintained over a large range of head resistances.

Figure 5A:
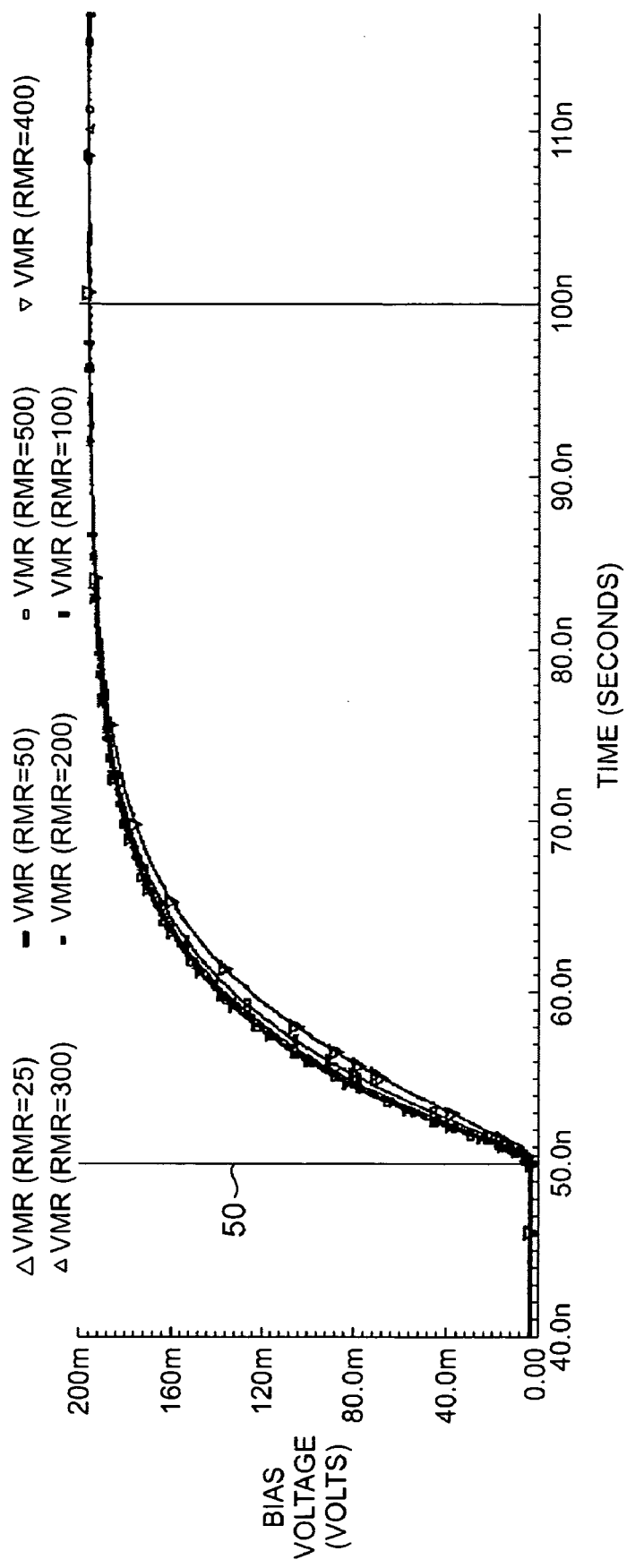
FIG. 5A is a graph illustrating the variations in bias voltage transitions across a head for different values of $R_{MR}$ in the circuit of FIG. 4.
Figure 5B:
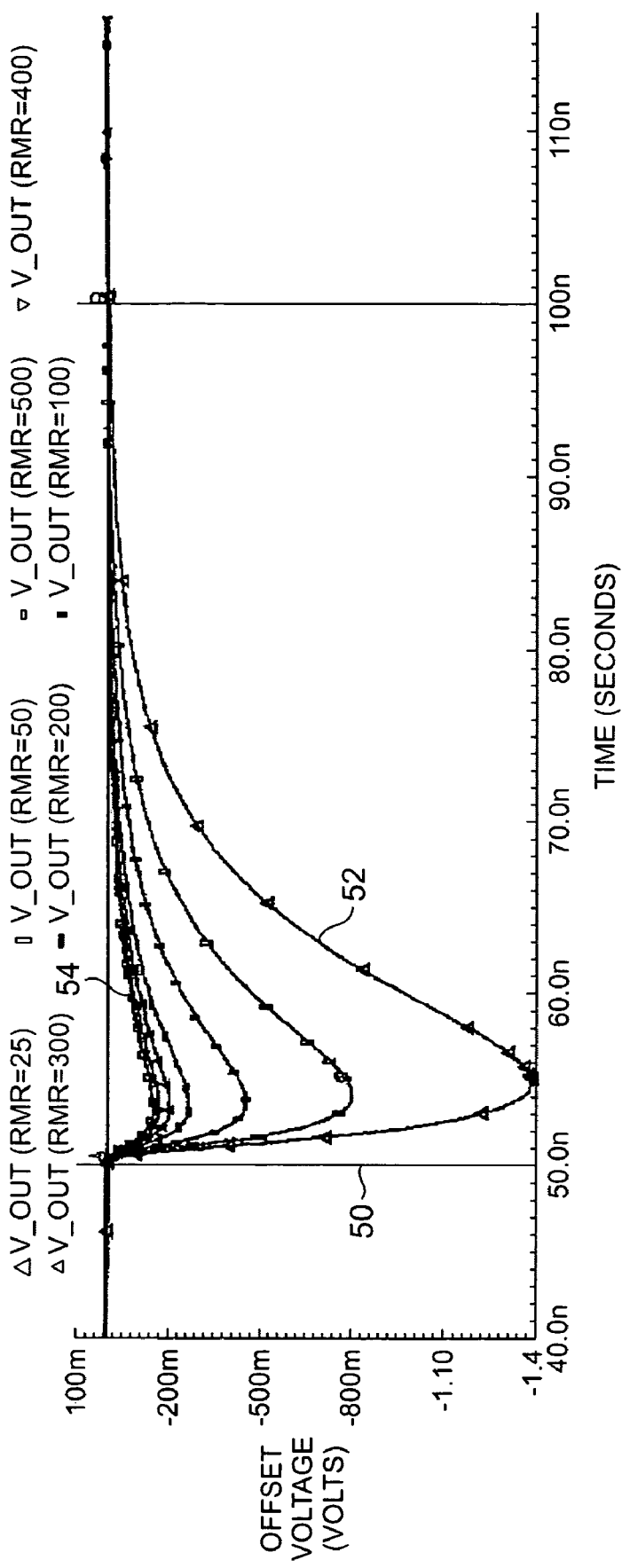
FIG. 5B is a graph illustrating the variations in reader offset signals for different values of $R_{MR}$ in the circuit of FIG. 4.

FIG. 5A is a graph illustrating the variations in bias voltage transitions across a head for different values of $R_{MR}$, and FIG. 5B is a graph illustrating the variations in reader offset signals (measured between VRP and VRN in FIG. 4) for different values of $R_{MR}$. The graphs in FIGS. 5A and 5B were both obtained using preamplifier circuit 40 shown in FIG. 4, with the reader offset signals being measured between VRP and VRN. A write-to-read transition command occurs at a point in time marked as 50 ns on the graphs, indicated by line 50. The bias voltage (shown in FIG. 5A) transitions from zero volts (its value during write mode) to a high value, such as about 200 milli-volts (mV), and reaches a steady state in less than 50 ns. This characteristic is true for values of $R_{MR}$ ranging from 25 Ohms (Ω) to 500 Ω (although the curves shown in FIG. 5A are not individually labeled because of the vary small variations between curves). Similarly, the reader offset signal (shown in FIG. 5B) initially deviates from a zero steady state value when the write-to-read transition occurs, but is able to return to zero in less than 50 ns. Again, this characteristic is true for values of $R_{MR}$ ranging from 25 Ω (curve 52) to 500 Ω (curve 54). These graphs illustrate the fact that the write-to-read recovery time of preamplifier circuit 40 (FIG. 4) is less than 50 ns, achieving improved performance compared to prior art preamplifiers.

Figure 6:
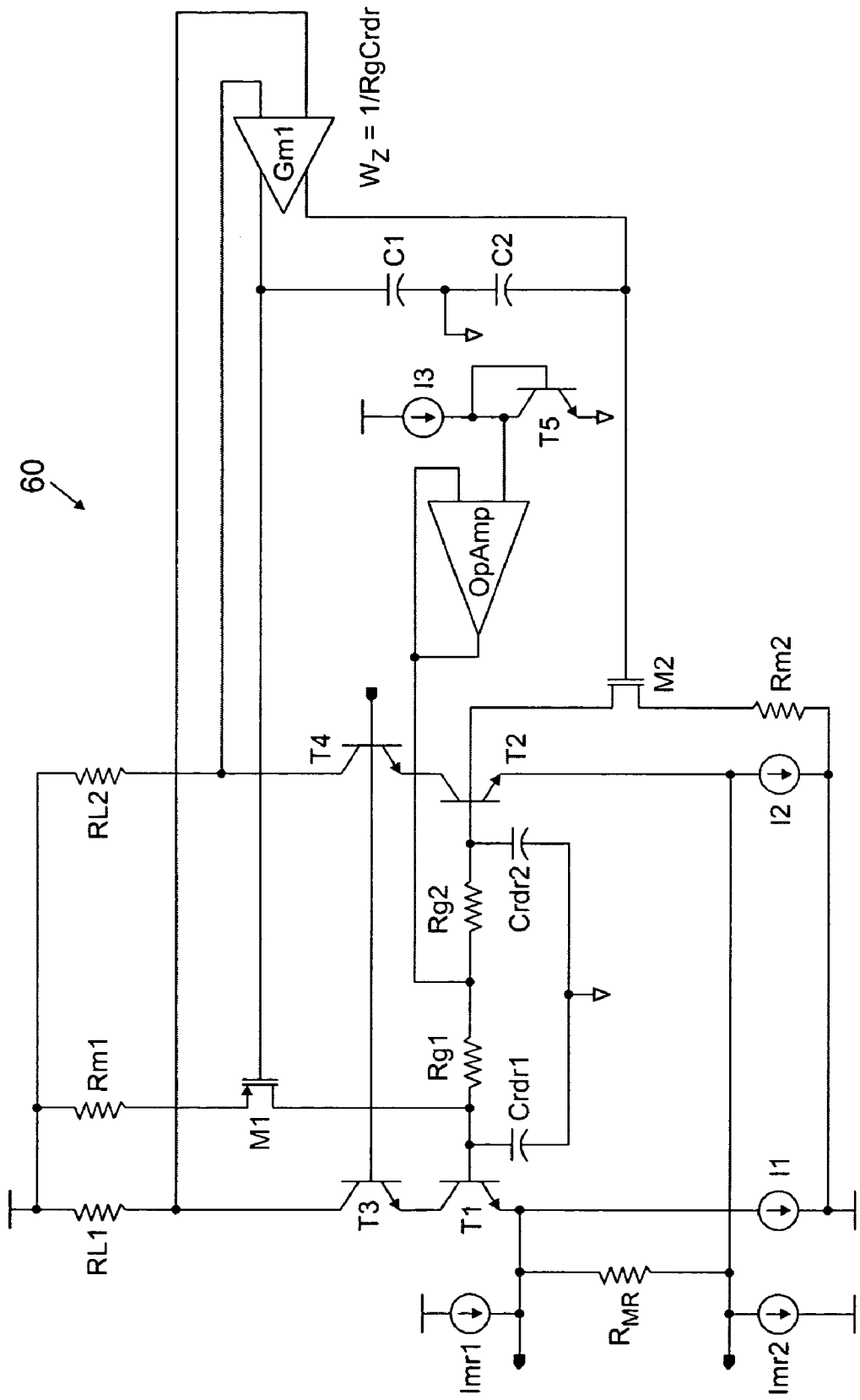
FIG. 6 is a schematic diagram of a preamplifier circuit having an integrated bias circuit and offset recovery circuit configured in current bias mode.

FIG. 6 is a schematic diagram of preamplifier circuit 60 having an integrated bias circuit and offset recovery circuit configured in current bias mode. Preamplifier circuit 60 includes a transducing head (modeled by resistor $R_{MR}$), current sources Imr1, Imr2, I1, I2 and I3, transistors T1, T2, T3, T4 and T5, current source transistors M1 and M2, load resistors RL1 and RL2, current source resistors Rm1 and Rm2, resistors Rg1 and Rg2, capacitors Crdr1, Crdr2, C1 and C2, transconductance amplifier Gm1, and operational amplifier OpAmp, connected as shown in FIG. 6. The desired current bias for the head ($R_{MR}$) is supplied by open circuit absolute current sources Imr1 and Imr2, which deliver the desired head current Imr. This generates an error signal across the load resistors RL1 and RL2, which is input to transconductance amplifier Gm1 to drive a complementary current source (implemented in the embodiment shown in FIG. 6 by transistors M1 and M2 and resistors Rm1 and Rm2). The complementary current source supplies current to resistors Rg1 and Rg2 until a potential of (Imr)($R_{MR}$) is developed across them. An additional feature of preamplifier circuit 60 is that a zero is included in the feedback loop to cancel the secondary pole that is created by the RC time constant of resistors Rg1 and Rg2 and capacitors Crdr1 and Crdr2, to ensure stability of the circuit.

Figure 7A:
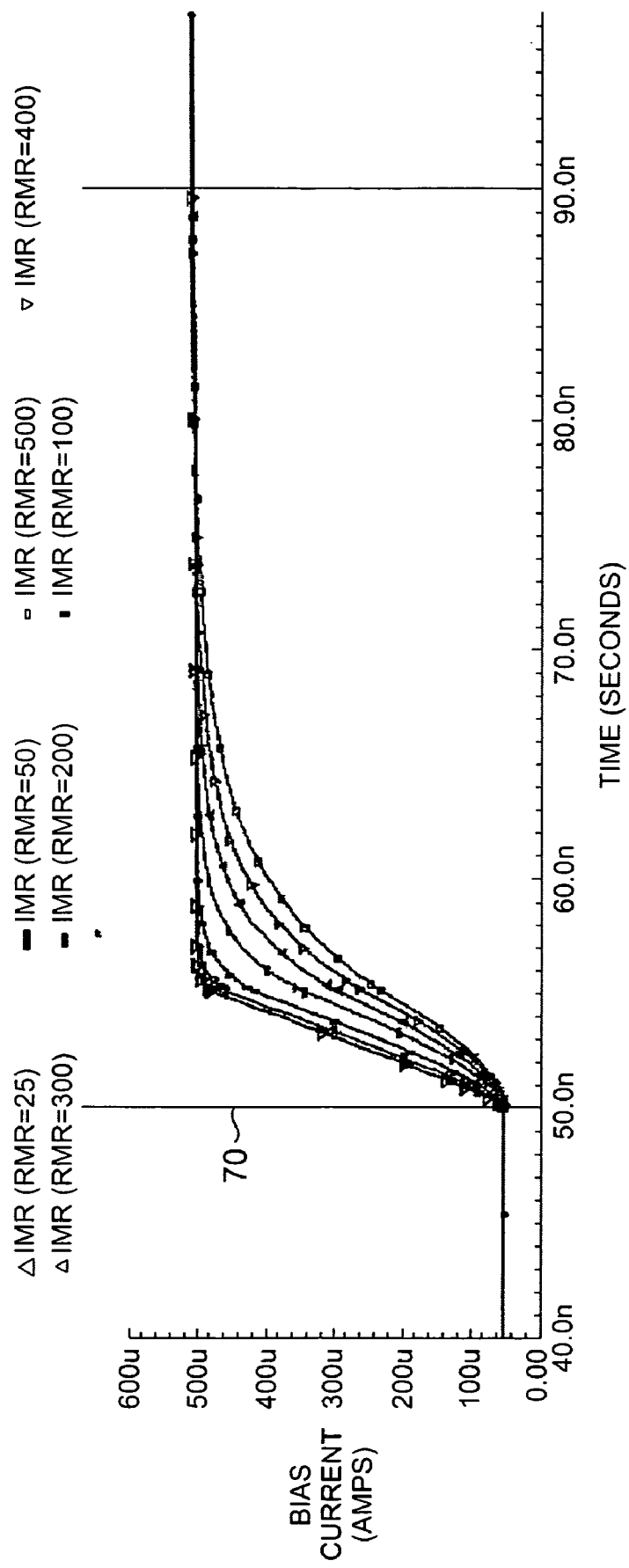
FIG. 7A is a graph illustrating the variations in bias current transitions across a head for different values of $R_{MR}$ in the circuit of FIG. 6.
Figure 7B:
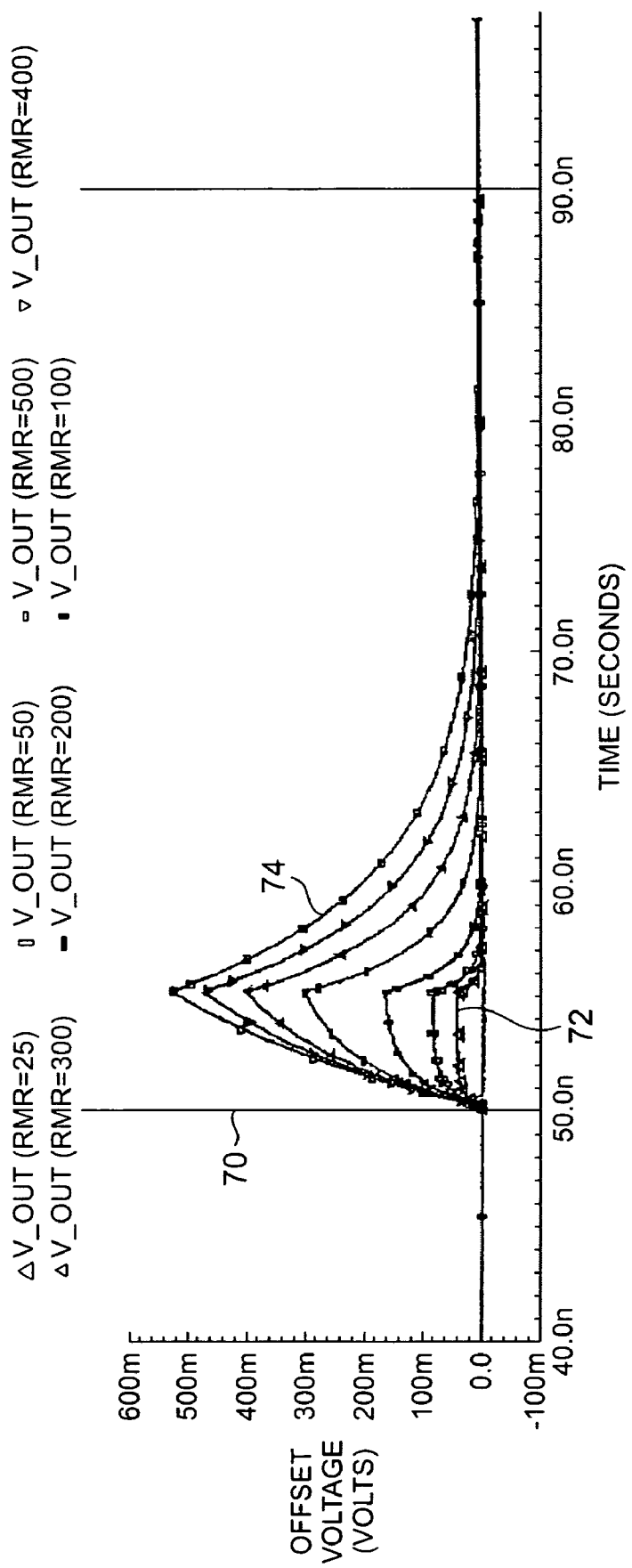
FIG. 7B is a graph illustrating the variations in reader offset signals for different values of $R_{MR}$ in the circuit of FIG. 6.

FIG. 7A is a graph illustrating the variations in bias current transitions across a head for different values of $R_{MR}$, and FIG. 7B is a graph illustrating the variations in reader offset signals for different values of $R_{MR}$. The graphs in FIGS. 7A and 7B were both obtained using preamplifier circuit 60 shown in FIG. 6, with the reader offset signals being measured between the terminals of resistors RL1 and RL2 opposite the supply voltage. A write-to-read transition command occurs at a point in time marked as 50 ns on the graphs, indicated by line 70. The bias current (shown in FIG. 7A) transitions from a low value (its value during write mode) to a high value, such as about 500 micro-amperes (μA), and reaches a steady state in less than 40 ns. This charatacteristic is true for values of $R_{MR}$ ranging from 25 Ω to 500 Ω (although the curves shown in FIG. 7A are not individually labeled because of the vary small variations between curves). Similarly, the reader offset signal (shown in FIG. 7B) initially deviates from a zero steady state value when the write-to-read transition occurs, but is able to return to zero in less than 40 ns. Again, this characteristic is true for values of $R_{MR}$ ranging from 25 Ω (curve 72) to 500 Ω (curve 74). These graphs illustrate the fact that the write-to-read recovery time of preamplifier circuit 60 (FIG. 6) is less than 40 ns, achieving improved performance compared to prior art preamplifiers.

Figure 8:
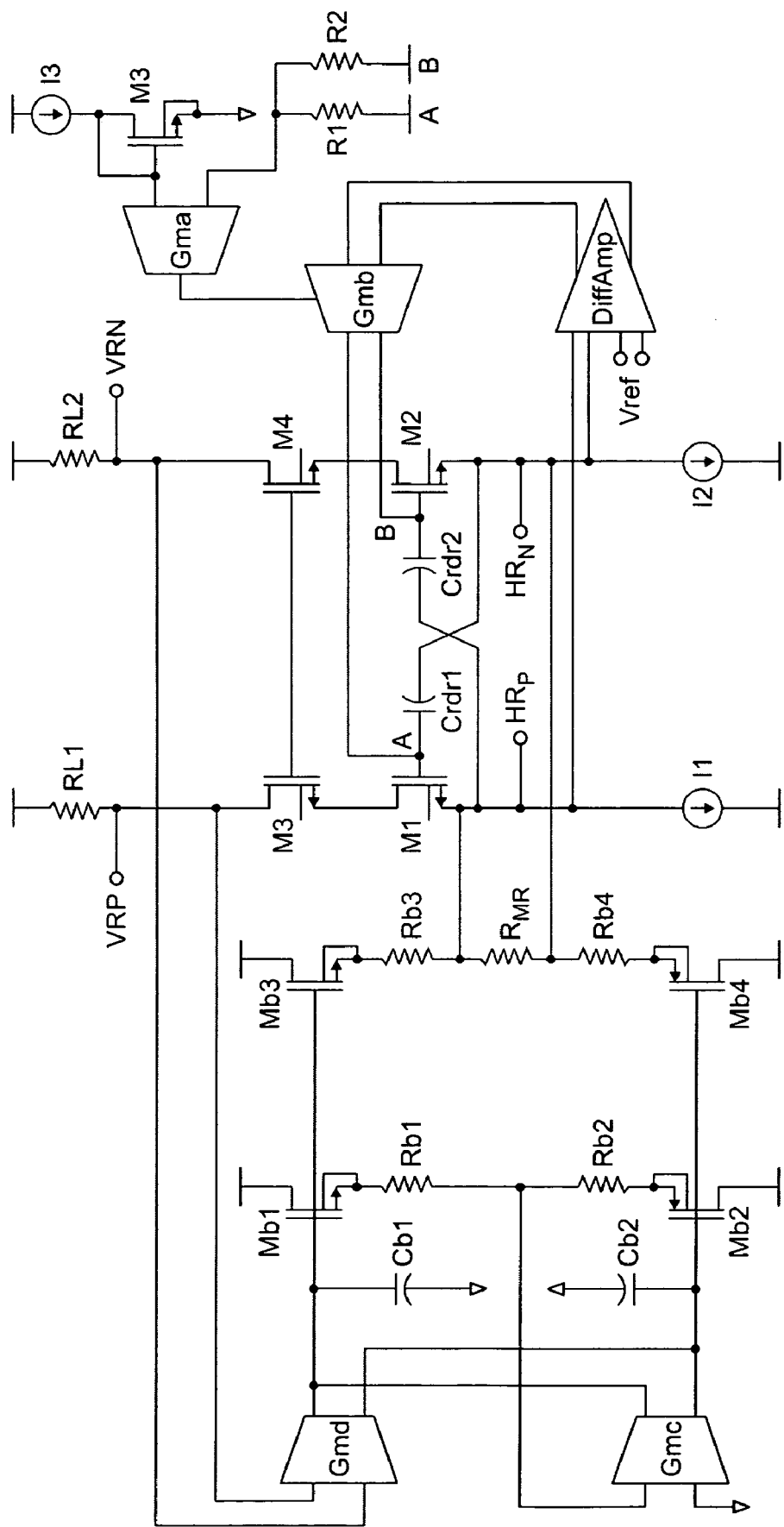
FIG. 8 is a schematic diagram of a preamplifier circuit having an integrated bias circuit and offset recovery circuit according to a further embodiment of the present invention.

FIG. 8 is a schematic diagram of preamplifier circuit 80 according to a further embodiment of the present invention. Similar to preamplifier circuit 40 shown in FIG. 4. preamplifier circuit 80 is configured with an integrated bias circuit and offset recovery circuit. Preamplifier circuit 80 is slightly different than preamplifier circuit 40, though, as the reference signal of preamplifier circuit 80 is not applied directly in an open loop fashion, but rather through a feedback control loop. Reference voltage Vmr is applied to differential amplifier DiffAmp, and drives nodes A and B according to the difference between the reference voltage and the bias voltage across the head ($R_{MR}$). The resulting error signal between nodes VRP and VRN drives the bias circuitry through transconductance amplifier Gmd, so that the current for biasing the head ($R_{MR}$) is provided by transistors Mb3 and Mb4. This configuration offers improved noise performance at low frequencies, which can be advantageous in perpendicular recording applications.

The present invention provides a preamplifier configuration for biasing a transducing head and amplifying readback signals from the head, that employs an integrated bias circuit and offset recovery (reader) circuit rather than independent bias and offset recovery circuits as were employed in the prior art. In an exemplary embodiment, the offset recovery circuit is operated by a transition from write mode to read mode, resulting in a differential voltage being developed across the head. A signal representative of the differential voltage across the head is provided to the bias circuit, so that the bias circuit is also activated by the transition from write mode to read mode. The bias circuit provide the desired bias across the head, with changes in the bias being quickly tracked by the offset recovery circuit. This configuration allows for improvement of the write-to-read recovery time, to below about 50 ns in exemplary embodiments. In addition, the characteristics of the circuit hold for a large range of values of the head resistance, over a ratio of 20:1 in exemplary embodiments.

Although the present invention has been described with reference to preferred embodiments, workers skilled in the art will recognize that changes may be made in form and detail without departing from the spirit and scope of the invention. Particularly, while some forms of the invention are described in the form of discrete devices, it is recognized that the circuit is preferably reduced to practice in the form of an integrated circuit (IC). Therefore, terms such as "device" and the like should be construed in their broadest contexts to include portions of ICs that are conveniently described as functional components, as well as discrete devices. Likewise, some forms of the invention are described in terms of logical gates and chips that could also be implemented by discrete devices, all within the scope and spirit of the present invention. Similarly, the present invention has been described in terms of exemplary embodiments employing FET or BJT transistor devices having a control region (gate/base) and multiple controlled regions (source and drain/collector and emitter). It will be understood by those skilled in the art that the principles of the present invention are applicable to circuits that employ other active devices having control and controlled regions or terminals.

The invention claimed is:

1. A preamplifier circuit connected to a transducing head, comprising:

an offset recovery circuit activated in response to a transition from write mode to read mode to provide an output signal representative of a signal across the transducing head; and a bias circuit driven by the output signal of the offset recovery circuit to bias the transducing head;

wherein the offset recovery circuit is configured to generate a reference signal in response to the transition from write mode to read mode, the reference signal representing a desired bias signal for biasing the transducing head, and to provide the output signal based on the reference signal and an actual bias signal for biasing the transducing head.

2. The preamplifier circuit of claim 1, wherein the bias circuit is a voltage bias circuit.

3. The preamplifier circuit of claim 1, wherein the bias circuit is a current bias circuit.

4. The preamplifier circuit of claim 1, wherein the offset recovery circuit comprises:

first and second current sources activated by the transition from write mode to read mode;

first and second resistors connected between the first and second current sources;

a first transistor circuit connected between the first current source and the first resistor, the first transistor circuit having a first load output signal and being connected to a first terminal of the transducing head;

a second transistor circuit connected between the second current source and the second resistor, the second transistor circuit having a second load output signal and being connected to a second terminal of the transducing head, wherein the output signal of the offset recovery circuit is a difference between the first load output signal and the second load output signal.

5. The preamplifier circuit of claim 1, wherein the offset recovery circuit includes common mode protection circuitry.

6. The preamplifier circuit of claim 1, wherein the output signal of the offset recovery circuit is input to the bias circuit via a first transconductance amplifier.

7. The preamplifier circuit of claim 6, wherein the first transconductance amplifier has first and second outputs, and wherein the bias circuit includes:

a first capacitor connected between the first output of the first transconductance amplifier and ground;

a second capacitor connected between the second output of the first transconductance amplifier and ground;

a first bias transistor circuit having a first bias transistor connected to the first output of the first transconductance amplifier, a first bias resistor connected to the first bias transistor, a second bias resistor connected to the first bias resistor, and a second bias transistor connected to the second bias resistor and to the second output of the first transconductance amplifier;

a second bias transistor circuit having a third bias transistor connected to the first output of the first transconductance amplifier, a third bias resistor connected between the third bias transistor and a first terminal of the transducing head, a fourth bias resistor connected to a second terminal of the transducing head, and a fourth bias transistor connected to the fourth bias resistor and to the second output of the first transconductance amplifier.

8. The preamplifier circuit of claim 7, wherein the bias circuit further includes a second transconductance amplifier having a first input connected to a node between the first bias resistor and the second bias resistor, a second input connected to ground, a first output connected the first output of the first transconductance amplifier, and a second output connected to the second output of the first transconductance amplifier.

9. The preamplifier circuit of claim 1, wherein the offset recovery circuit includes first and second capacitors connected to filter thermal noise.

10. The preamplifier circuit of claim 1, wherein the offset recovery circuit and the bias circuit are both realized in an integrated circuit (IC).

11. A method of providing a bias signal for biasing a transducing head, comprising:
  generating an offset recovery signal representative of a signal across the transducing head in response to a transition from write mode to read mode; and
  driving a bias circuit with the offset recovery signal to provide the bias signal for biasing the transducing head;
  wherein generating the offset recovery signal comprises:
    generating a reference signal in response to the transition from write mode to read mode, the reference signal representing a desired bias signal for biasing the transducing head; and
    generating the offset recovery signal based on the reference signal and an actual bias signal for biasing the transducing head.

12. The method of claim 11, wherein driving the bias circuit comprises providing a voltage for application across the transducing head.

13. The method of claim 11, wherein driving the bias circuit comprises providing a current for application through the transducing head.

14. The method of claim 11, wherein generating the reference signal comprises:
  activating a first current source and a second current source to provide current through a first resistor and a second resistor in response to the transition from write mode to read mode, thereby generating the reference signal as a voltage across the first and second resistors.

15. The method of claim 11, further comprising:
  providing common mode protection in generating the offset recovery signal.

16. The method of claim 11, further comprising:
  filtering thermal noise associated with the offset recovery signal.

* * * * *